United States Patent
Ruppert et al.

(10) Patent No.: US 11,856,739 B2
(45) Date of Patent: Dec. 26, 2023

(54) COOLING COMPONENTS, CONVERTER, AND AIRCRAFT

(71) Applicant: Rolls-Royce Deutschland Ltd & Co KG, Blankenfelde-Mahlow (DE)

(72) Inventors: Swen Ruppert, Möhrendorf (DE); Antonio Zangaro, Schwanstetten (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 284 days.

(21) Appl. No.: 17/261,331

(22) PCT Filed: Jul. 8, 2019

(86) PCT No.: PCT/EP2019/068243
§ 371 (c)(1),
(2) Date: Jan. 19, 2021

(87) PCT Pub. No.: WO2020/020619
PCT Pub. Date: Jan. 30, 2020

(65) Prior Publication Data
US 2021/0267087 A1    Aug. 26, 2021

(30) Foreign Application Priority Data
Jul. 23, 2018    (DE) .................... 10 2018 2121 96.6

(51) Int. Cl.
*H05K 7/20* (2006.01)
*F28F 1/00* (2006.01)
(Continued)

(52) U.S. Cl.
CPC ............. *H05K 7/209* (2013.01); *F28F 3/022* (2013.01); *F28D 2021/0021* (2013.01);
(Continued)

(58) Field of Classification Search
None
See application file for complete search history.

(56) References Cited

U.S. PATENT DOCUMENTS

| 6,039,114 A | 3/2000 | Becker |
| 6,343,016 B1 | 1/2002 | Lin |
| (Continued) | | |

FOREIGN PATENT DOCUMENTS

| DE | 102013219388 A1 | 4/2014 |
| DE | 102014214209 A1 | 1/2016 |
| (Continued) | | |

OTHER PUBLICATIONS

Baumann, Heinrich, et al. "Optimized cooling systems for high-power semiconductor devices." IEEE Transactions on Industrial Electronics 48.2 (2001): 298-306.
(Continued)

*Primary Examiner* — Courtney L Smith
(74) *Attorney, Agent, or Firm* — Lempia Summerfield Katz LLC

(57) ABSTRACT

The disclosure relates to a device for cooling components. The device includes a main body and cylindrical and/or conical cooling fins which are formed in the main body and around which a coolant may flow, wherein the cooling fins are formed in parallel first rows and equally spaced apart from one another. Neighboring first rows are arranged offset from one another in the row direction in such a way that the axes of neighboring cooling fins of the neighboring first rows are offset by at least 25% of the hydraulic diameter of the cooling fins. The disclosure also relates to a converter and an aircraft including a device of this type.

18 Claims, 5 Drawing Sheets

(51) Int. Cl.
*F28F 3/02* (2006.01)
*F28D 21/00* (2006.01)
*F28F 13/00* (2006.01)

(52) U.S. Cl.
CPC ........ *F28D 2021/0029* (2013.01); *F28F 1/00* (2013.01); *F28F 13/00* (2013.01)

(56) References Cited

U.S. PATENT DOCUMENTS

| | | | | |
|---|---|---|---|---|
| 6,729,383 | B1* | 5/2004 | Cannell | ................ H01L 23/473 |
| | | | | 257/E23.098 |
| 10,809,017 | B2* | 10/2020 | Arata | ...................... F28F 3/048 |
| 2006/0021736 | A1 | 2/2006 | Tran | |
| 2007/0000650 | A1 | 1/2007 | Nishimura | |
| 2011/0188204 | A1* | 8/2011 | Horiuchi | ............ H05K 7/20927 |
| | | | | 29/527.1 |
| 2017/0107974 | A1* | 4/2017 | Goessling | ............... H02J 3/381 |
| 2017/0245394 | A1 | 8/2017 | Matte | |
| 2021/0153394 | A1* | 5/2021 | Mitic | .................. F28D 15/0233 |
| 2022/0293491 | A1* | 9/2022 | Koyama | ................ F28F 3/027 |

FOREIGN PATENT DOCUMENTS

| | | |
|---|---|---|
| DE | 102016218453 A1 | 3/2018 |
| WO | 2017195270 A1 | 11/2017 |
| WO | 2017213949 A1 | 12/2017 |

OTHER PUBLICATIONS

German Office Action for German Application No. 10 2018 212 196.6 dated Mar. 6, 2019.
International Search Report and the Written Opinion for International Patent Application PCT/EP2019/068243 dated Oct. 30, 2019.

* cited by examiner

COOLING COMPONENTS, CONVERTER, AND AIRCRAFT

The present patent document is a § 371 nationalization of PCT Application Serial No. PCT/EP2019/068243, filed Jul. 8, 2019, designating the United States, which is hereby incorporated by reference, and this patent document also claims the benefit of German Patent Application No. 10 2018 212 196.6, filed Jul. 23, 2018, which is also hereby incorporated by reference.

TECHNICAL FIELD

The disclosure relates to a device for cooling components, having a main body, in which cylindrical and/or conical cooling fins are formed, wherein the cooling fins are formed in parallel rows and equally spaced apart from one another.

The disclosure also relates to a converter and to an aircraft having a device of this kind.

BACKGROUND

Owing to the requirement for ever more compact and more robust power-electronic systems, there is a strong demand for more efficient cooling methods. Precisely in the case of high-power densities, various versions of liquid coolers have become established, inter alia. It is important in this context to enlarge the surface area of heatsinks connected to power-electronic components.

Particularly in power electronics, e.g., for inverters, "pin fin arrangements" (e.g., arrangements of cylindrical or pin-shaped cooling fins on a main body) have proven their worth in the case of heatsinks with a liquid cooling medium. Such an arrangement of pin fins is disclosed in German Laid-Open Application DE 10 2014 214 209 A1, for example.

FIG. 1 shows, by way of example, a plan view of a device having cooling fins 1 according to the prior art. It shows cylindrical cooling fins 1 (e.g., pin fins), which are arranged in a metallic main body 2. It shows a structure that has straight diagonal milling lines at an angle of 45 degrees to the flow direction D of a coolant flowing through (not illustrated). From a simulation of speeds of flow of a coolant, it has been realized that a large proportion of the coolant does not impinge upon the cooling fins 1, and therefore the heat transfer potential of the coolant is not fully exhausted.

A converter which uses an AC voltage or DC voltage to produce an AC voltage of a different frequency and amplitude is referred to as an inverter. Inverters may be configured as AC/DC-DC/AC inverters or DC/AC inverters, wherein an AC output voltage is generated from an AC input voltage or a DC input voltage via a DC link and switched semiconductors.

An aircraft is understood to mean any type of airborne device of locomotion or transportation, whether manned or unmanned.

SUMMARY

It is the object of the disclosure to specify a solution with the aid of which cooling of components, e.g., power semiconductors or electric motors, may be accomplished more efficiently.

According to the disclosure, the stated object is achieved by the device, the converter, and the aircraft as described herein. The scope of the present disclosure is defined solely by the appended claims and is not affected to any degree by the statements within this summary. The present embodiments may obviate one or more of the drawbacks or limitations in the related art.

According to the disclosure, cylindrical and/or conical cooling fins are arranged on a heatsink in a manner offset selectively with respect to one another in such a way that a coolant flowing past is "swirled" more effectively, thus providing that the coolant impinges upon the cooling fins over the full area thereof, as a result of which the heat transfer from the heatsink to the coolant is increased over known solutions. Moreover, the "lee zone" (e.g., very low speed of flow) behind the cooling fins is reduced in size.

In the text which follows, the term "cylindrical" is interpreted to mean any three-dimensional body with parallel generator lines, wherein the base area may have any desired shape, that is to say even a prism is a cylinder in this mathematical definition. In the text which follows, the term "conical" is interpreted to mean any three-dimensional body with generator lines that converge to a point, wherein the base area may have any desired shape. Truncated cones, pyramids and truncated pyramids also fall within the mathematical term "conical".

The disclosure relates to a device for cooling components, having a main body and cylindrical and/or conical cooling fins, which are formed in the main body and around which a coolant may flow in a predetermined flow direction, wherein the cooling fins are formed in parallel first rows and equally spaced apart from one another.

Adjacent first rows are arranged offset with respect to one another in the row direction in such a way that the axes of adjacent cooling fins of adjacent first rows are offset by at least 25% of the hydraulic diameter of the cooling fins in such a way that cooling fins situated in series in the flow direction are offset transversely to the flow direction and that no rows of cooling fins that are formed in alignment with the flow direction are formed.

As a result, the cooling fins are not struck by a single meandering streamline of the coolant but by different intermingled streamlines.

In this context, "alignment" (e.g., aligned row) is used to denote a straight line or arrangement in a straight line.

In a development, each of the first rows may be offset by the same first offset with respect to the preceding first row, wherein the first offset may be 1 to 3 mm.

In another embodiment, it is possible for only every second one of the first rows to be offset by the same first offset with respect to the preceding first row, wherein the first offset may be 1 to 3 mm.

Moreover, adjacent second rows, which are formed transversely to the first rows by the offsetting of the first rows, are arranged offset with respect to one another in the row direction in such a way that the axes of adjacent cooling fins of adjacent second rows are offset by at least 25% of the mean diameter of the cooling fins.

In a development, each second row may be offset by the same second offset with respect to the preceding second row, wherein the second offset may be 1 to 3 mm.

In another embodiment, it is possible for only every second one of the second rows to be offset by the same second offset with respect to the preceding second row, wherein the second offset may be 1 to 3 mm.

The disclosure also relates to a converter having a device as described herein, wherein the coolant flows around the cooling fins. The converter is, in particular, an inverter.

The disclosure also relates to an aircraft having a converter, as described herein, for an electric or hybrid-electric aircraft propulsion system, wherein the aircraft may be an airplane.

In another variant, the aircraft may have an electric motor supplied with electrical energy by the inverter, wherein a propeller may be set in rotation by the electric motor.

BRIEF DESCRIPTION OF THE DRAWINGS

Further special features and advantages of the disclosure will become clear from the following explanations of an exemplary embodiments with reference to schematic drawings, in which.

DETAILED DESCRIPTION

Figure 1:
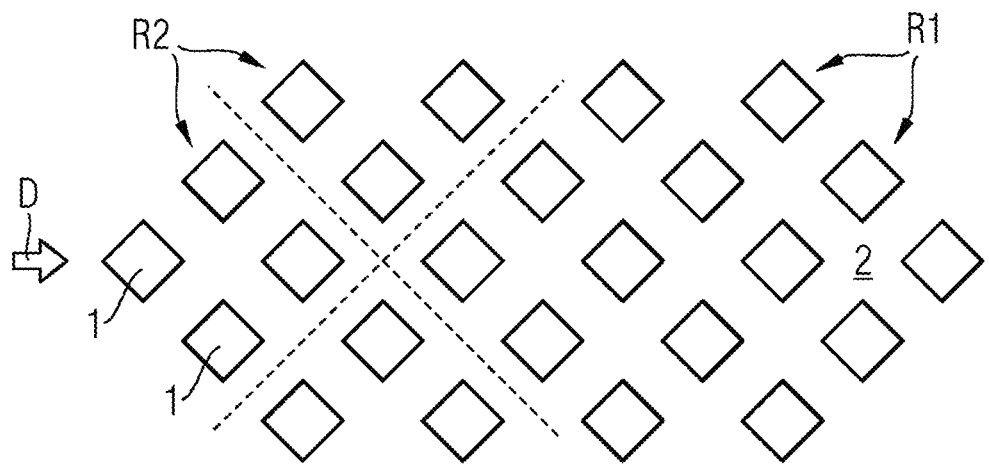
FIG. 1 depicts a device having cooling fins according to the prior art.
Figure 2:
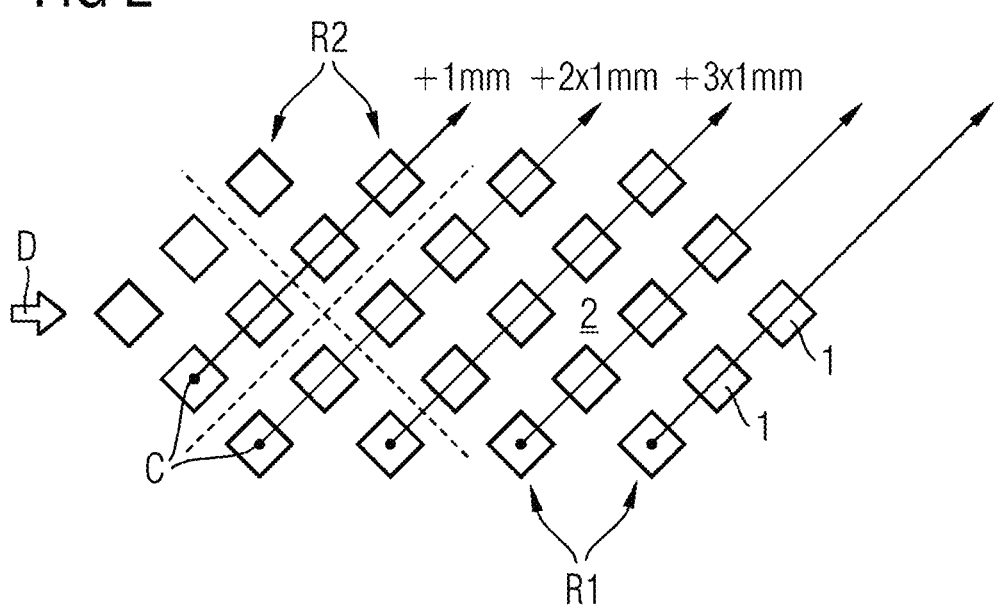
FIG. 2 depicts an example of a device having cooling fins according to the illustrated first design rule.

FIG. 2 shows a plan view of a device having first rows R1 and second rows R2 of cylindrical cooling fins 1 (e.g., pin fins), which are formed in a main body 2. The cooling fins 1 project from the plane of the drawing. The cooling fins 1 have a hydraulic diameter of about 3 mm, for example. According to the disclosure, adjacent first rows R1 of cooling fins 1 are formed in a manner offset by 1.2 mm, 3 mm, 4.5 mm, etc. in the direction of the arrow with respect to the first of the first rows R1 (e.g., first design rule), with the result that the axes C of adjacent cooling fins 1 of adjacent first rows R1 are arranged offset by in each case about 1.5 mm in the row direction with respect to the adjacent row. The result of this displacement by the first offset V1 of about 1.5 mm may be seen in the device in FIG. 3.

Figure 3:
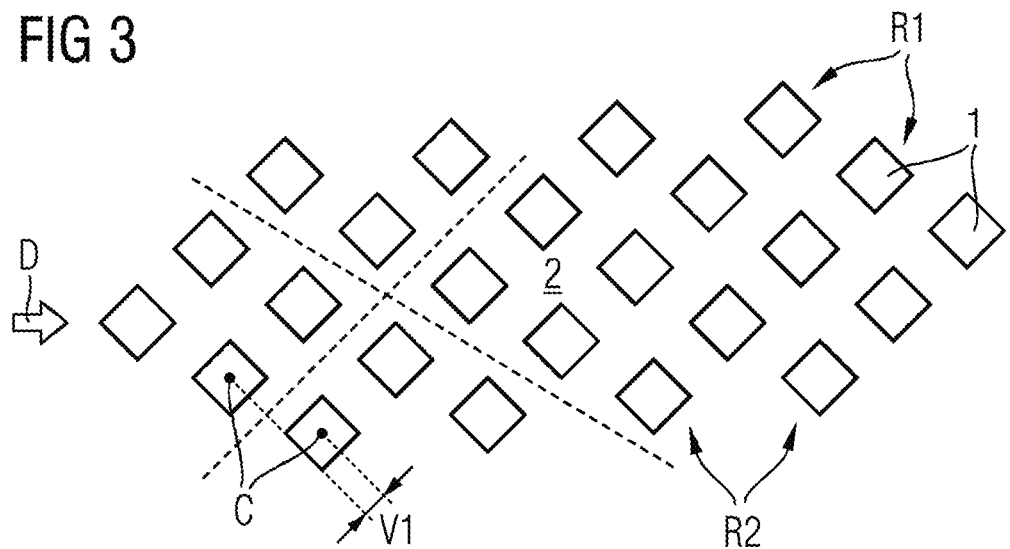
FIG. 3 depicts an example of a device having cooling fins after the application of the first design rule.

FIG. 3 shows the cylindrical cooling fins 1 arranged offset according to the first design rule. The first rows R1 have an offset V1 of about 1.5 mm (between the axes C of adjacent cooling fins 1) with respect to one another. The cooling fins 1 are formed in a main body 2, e.g., made of metal or ceramics. They are perpendicular to the plane of the drawing. Second rows R2 of cooling fins 1 are formed transversely to the first rows R1.

Simulations of speeds of flow of a coolant flowing in the direction D show that coolant flowing past an arrangement of first rows R1 of cooling fins 1 arranged in an offset manner has a large amount of contact with the surface of the cooling fins 1 owing to the offset arrangement of the first rows R1 of cooling fins 1. Moreover, the simulation shows that the "lee zone" behind the cooling fins 1 is reduced in size and that the coolant cannot flow through the device without heat transfer.

Meandering flow of the coolant without contact with the cooling fins 1 is prevented, thereby increasing the mixing of the coolant and enabling thermodynamically desired turbulence to be formed more effectively (e.g., the degree of turbulence is increased).

By virtue of the first design rule, no rows of cooling fins 1 which are in alignment with the flow direction D are formed.

Figure 4:
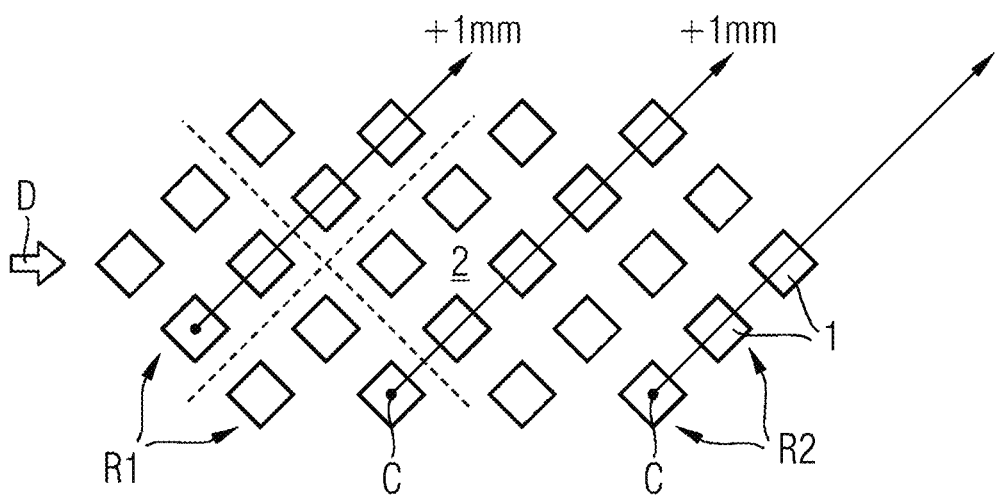
FIG. 4 depicts an example of a device having cooling fins according to an illustrated further, alternative first design rule.

FIG. 4 shows an application according to the disclosure of the first design rule which is an alternative to FIG. 2. In this variant of the device, only every second of the first rows R1 is formed in manner offset by about 1.5 mm in the direction of the arrow. A similar effect to that achieved by the measure according to FIG. 2 is thereby achieved.

Figure 5:
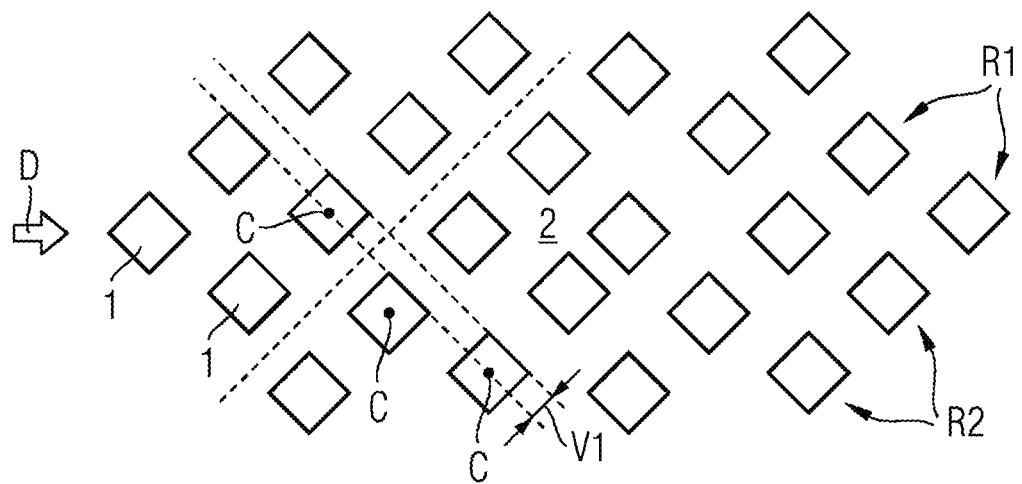
FIG. 5 depicts an example of a device having cooling fins according to an alternative application of the first design rule.

FIG. 5 shows the results of the alternative application of the first design rule with a first offset V1 of the axes C of about 1.5 mm.

Figure 6:
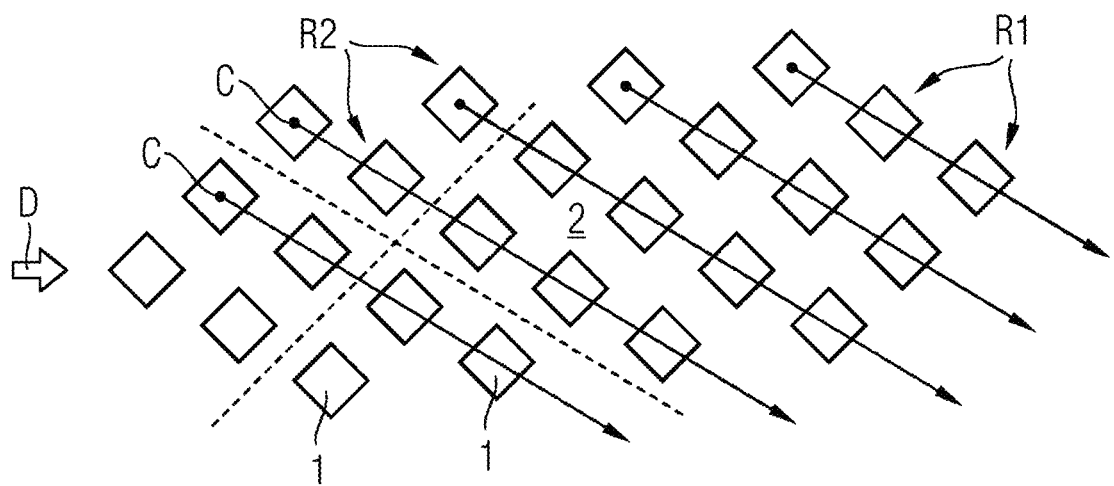
FIG. 6 depicts an example of a device having cooling fins and the illustrated second design rule.

In addition, the second rows R2 of cooling fins 1 which result from the abovementioned first design rule and which are formed transversely to the first rows R1 by the first design rule, may be arranged offset with respect to one another in the row direction of the second rows R2 according to a second design rule. The second design rule may be seen from FIG. 6.

Figure 7:
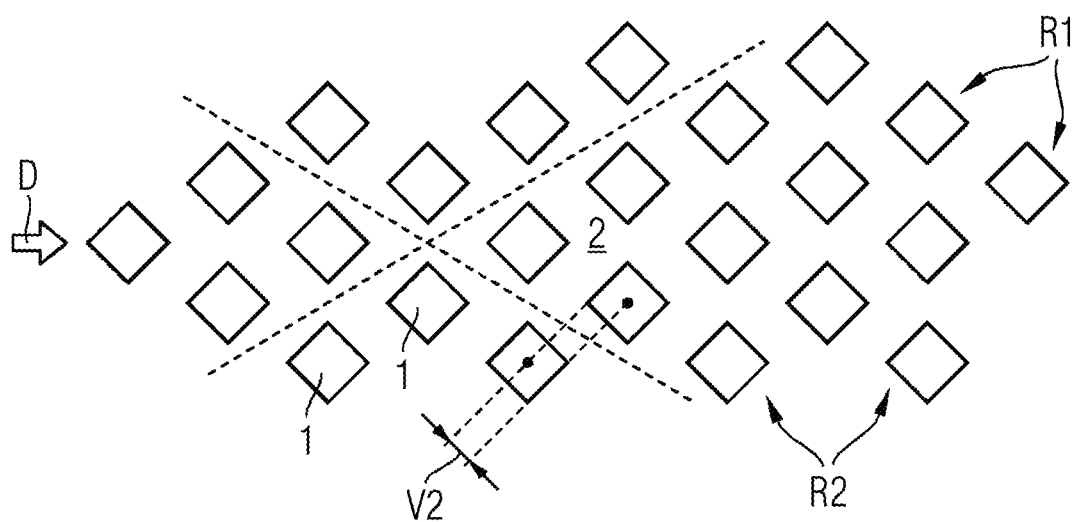
FIG. 7 depicts an example of a device having cooling fins after the application of the second design rule.

FIG. 7 shows the result of the application of the second design rule to the cylindrical cooling fins 1 arranged offset according to the first design rule. The second rows R2 have a second offset V2 of about 1.5 mm (between the axes C of adjacent cooling fins 1) with respect to one another. The cooling fins 1 are formed in a main body 2, e.g., made of metal or ceramics. They are perpendicular to the plane of the drawing.

As a result, the coolant flowing past two adjacent cooling fins 1 may impinge upon the next cooling fin 1 as close as possible to the tip, as a result of which the speed of the coolant is also locally increased, improving heat dissipation. This advantage also applies to the first design rule.

Figure 8:
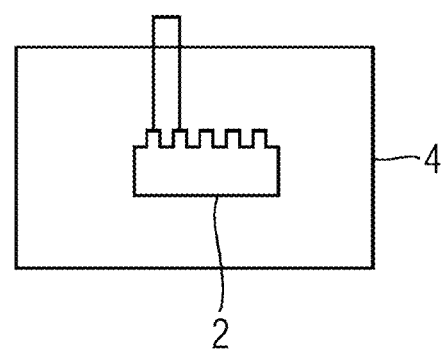
FIG. 8 depicts an example of a block diagram of an inverter having a device for cooling.

FIG. 8 shows a block diagram of an inverter 4 having a device for cooling power-electronic components according to FIG. 2 to FIG. 7. The inverter 4 has a main body 2 with cooling fins 1 formed therein. The inverter 4 is an embodiment of a converter.

Figure 9:
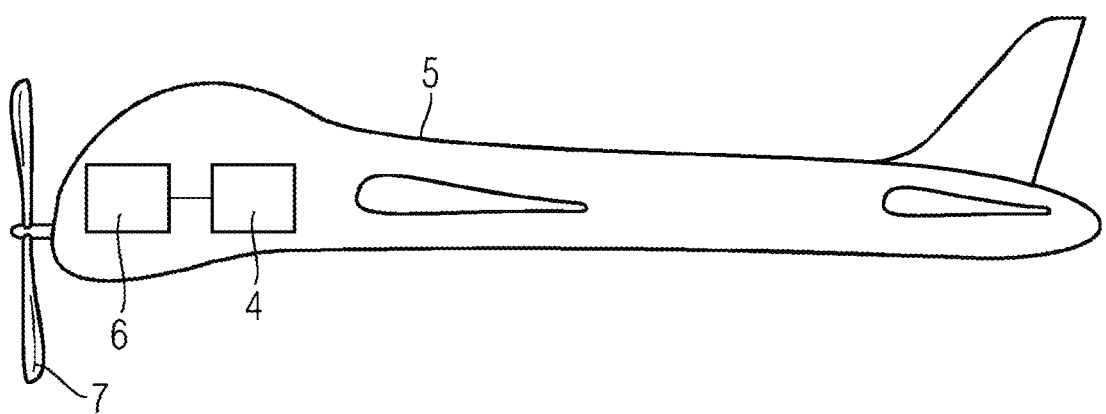
FIG. 9 depicts an example of an aircraft having an electric aircraft propulsion system.

FIG. 9 shows an electric or hybrid-electric aircraft 5, (e.g., an airplane), including an inverter 4 according to FIG. 8 which supplies an electric motor 6 with electrical energy. The electric motor 6 drives a propeller 7.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS 1 cooling fin
2 main body
4 inverter
5 aircraft
6 electric motor
7 propeller
C axis of a cooling fin 1
D flow direction of the coolant
R1 first row of cooling fins 1
R2 second row of cooling fins 1

The invention claimed is:

1. A device for cooling components, the device comprising:
a main body; and
cylindrical and/or conical cooling fins, wherein the cooling fins are positioned in the main body,
wherein a coolant is configured to flow around the cooling fins in a flow direction,
wherein the cooling fins are positioned in parallel first rows and equally spaced apart from one another,
wherein each first row of the parallel first rows is arranged along a row direction that is different from the flow direction, and
wherein adjacent first rows of the parallel first rows are arranged offset with respect to one another in the row direction such that, for each cooling fin in the parallel first rows, an axis of a respective first cooling fin in one first row is offset by at least 25% of a hydraulic diameter from an axis of a respective second cooling fin in an adjacent first row such that the respective first and second cooling fins are situated in series in the flow direction and are offset transversely to the flow direction and are not parallel with the flow direction such that no rows of cooling fins are formed in alignment with the flow direction.

2. The device of claim 1, wherein each first row of the parallel first rows is offset by a same first offset with respect to a preceding first row of the parallel first rows.

3. The device of claim 1, wherein only every second one of the parallel first rows is offset by a same first offset with respect to a preceding first row.

4. The device of claim 3, wherein the first offset is 1 to 6 mm.

5. The device of claim 1, wherein adjacent second rows of the cooling fins are each positioned in a second row direction that is transverse to the row direction of the parallel first rows of the cooling fins by an offsetting of the parallel first rows,
wherein the adjacent second rows of the cooling fins are arranged offset with respect to one another in the second row direction such that axes of adjacent cooling fins of the adjacent second rows are offset by at least 25% of a mean diameter of the cooling fins.

6. The device of claim 5, wherein each second row is offset by a same second offset with respect to a preceding second row.

7. The device of claim 5, wherein only every second one of the adjacent second rows is offset by a same second offset with respect to a preceding second row.

8. The device of claim 7, wherein the second offset is 2 to 6 mm.

9. A converter comprising:
a device having:
a main body; and
cylindrical and/or conical cooling fins, wherein the cooling fins are positioned in the main body,
wherein a coolant is configured to flow around the cooling fins in a flow direction,
wherein the cooling fins are positioned in parallel first rows and equally spaced apart from one another,
wherein each first row of the parallel first rows is arranged along a row direction that is different from the flow direction, and
wherein adjacent first rows of the parallel first rows are arranged offset with respect to one another in the row direction such that, for each cooling fin in the parallel first rows, an axis of a respective first cooling fin in one first row is offset by at least 25% of a hydraulic diameter from an axis of a respective second cooling fin in an adjacent first row such that the respective first and second cooling fins are situated in series in the flow direction and are offset transversely to the flow direction and are not parallel with the flow direction such that no rows of cooling fins are formed in alignment with the flow direction.

10. The converter of claim 9, wherein the converter is an inverter.

11. An aircraft comprising:
a converter for an electric or hybrid-electric aircraft propulsion system, wherein the converter comprises a device having:
a main body; and
cylindrical and/or conical cooling fins, wherein the cooling fins are positioned in the main body,
wherein a coolant is configured to flow around the cooling fins in a flow direction,
wherein the cooling fins are positioned in parallel first rows and equally spaced apart from one another,
wherein each first row of the parallel first rows is arranged along a row direction that is different from the flow direction,
wherein adjacent first rows of the parallel first rows are arranged offset with respect to one another in the row direction such that, for each cooling fin in the parallel first rows, an axis of a respective first cooling fin in one first row is offset by at least 25% of a hydraulic diameter from an axis of a respective second cooling fin in an adjacent first row such that the respective first and second cooling fins are situated in series in the flow direction and are offset transversely to the flow direction and are not parallel with the flow direction such that no rows of cooling fins are formed in alignment with the flow direction.

12. The aircraft of claim 11, wherein the aircraft is an airplane.

13. The aircraft of claim 12, further comprising:
an electric motor configured to be supplied with electrical energy by the converter; and
a propeller configured to be set in rotation by the electric motor.

14. The aircraft of claim 13, wherein the converter is an inverter.

15. The aircraft of claim 11, further comprising:
an electric motor configured to be supplied with electrical energy by the converter; and
a propeller configured to be set in rotation by the electric motor.

16. The aircraft of claim 15, wherein the converter is an inverter.

17. The device of claim 2, wherein the first offset is 1 to 6 mm.

18. The device of claim 6, wherein the second offset is 2 to 6 mm.

* * * * *